US011127518B2

(12) United States Patent
Campiglio et al.

(10) Patent No.: US 11,127,518 B2
(45) Date of Patent: Sep. 21, 2021

(54) TUNNEL MAGNETORESISTANCE (TMR) ELEMENT HAVING COBALT IRON AND TANTALUM LAYERS

(71) Applicant: Allegro MicroSystems, LLC, Manchester, NH (US)

(72) Inventors: Paolo Campiglio, Arcueil (FR); Amal Hamdache, Limours (FR); Julien Voillot, Chilly Mazarin (FR)

(73) Assignee: ALLEGRO MICROSYSTEMS, LLC, Manchester, NH (US)

( * ) Notice: Subject to any disclaimer, the term of this patent is extended or adjusted under 35 U.S.C. 154(b) by 46 days.

(21) Appl. No.: 16/574,419

(22) Filed: Sep. 18, 2019

(65) Prior Publication Data
US 2021/0065949 A1     Mar. 4, 2021

Related U.S. Application Data

(60) Provisional application No. 62/894,114, filed on Aug. 30, 2019.

(51) Int. Cl.
*H01F 10/32*     (2006.01)

(52) U.S. Cl.
CPC .................. *H01F 10/3254* (2013.01)

(58) Field of Classification Search
CPC .................................. H01F 10/3254
See application file for complete search history.

(56) References Cited

U.S. PATENT DOCUMENTS

| 6,473,275 B1 | 10/2002 | Gill |
| 6,937,497 B1 | 8/2005 | Ju et al. |
| 9,741,372 B1* | 8/2017 | Campiglio ........... G11B 5/3903 |
| 9,812,637 B2 | 11/2017 | Fermon et al. |
| 10,509,058 B2 | 12/2019 | Cadugan et al. |
| 2002/0054463 A1 | 5/2002 | Mukoyama et al. |
| 2003/0031894 A1 | 2/2003 | Lin et al. |
| 2003/0184918 A1 | 10/2003 | Lin et al. |
| 2006/0152859 A1 | 7/2006 | Childress et al. |
| 2006/0267056 A1 | 11/2006 | Ju et al. |
| 2007/0063237 A1 | 3/2007 | Huai et al. |
| 2007/0253118 A1* | 11/2007 | Hayakawa ............. G11C 11/16 360/324.2 |

(Continued)

FOREIGN PATENT DOCUMENTS

| DE | 10 2006 010 652 A1 | 9/2007 |
| EP | 2 880 665 A1 | 6/2015 |

(Continued)

OTHER PUBLICATIONS

Response to Office Action filed on Dec. 29, 2020 for U.S. Appl. No. 16/047,342; 14 pages.

(Continued)

*Primary Examiner* — Daniel J. Schleis
*Assistant Examiner* — Kevin C T Li
(74) *Attorney, Agent, or Firm* — Daly, Crowley, Mofford & Durkee, LLP

(57) ABSTRACT

In one aspect, a tunnel magnetoresistance (TMR) element includes a magnesium oxide (MgO) layer, a cobalt iron boron (CoFeB) layer in direct contact with the MgO layer and a cobalt iron (CoFe) layer. The TMR element also includes a tantalum layer in direct contact with the CoFeB layer and the CoFe layer.

5 Claims, 6 Drawing Sheets

(56) References Cited

U.S. PATENT DOCUMENTS

| | | | |
|---|---|---|---|
| 2010/0327857 A1 | 12/2010 | Hoshiya et al. | |
| 2011/0062537 A1 | 3/2011 | Oh et al. | |
| 2011/0163739 A1 | 7/2011 | Ono et al. | |
| 2011/0169488 A1 | 7/2011 | Mather | |
| 2012/0070695 A1 | 3/2012 | Kitagawa et al. | |
| 2012/0112741 A1 | 5/2012 | Meguro et al. | |
| 2012/0280336 A1* | 11/2012 | Jan | H01L 43/12 257/421 |
| 2014/0110803 A1 | 4/2014 | Apalkov et al. | |
| 2015/0194597 A1 | 7/2015 | Fermon et al. | |
| 2016/0161574 A1 | 6/2016 | Zimmer | |
| 2016/0204341 A1 | 7/2016 | Gan et al. | |
| 2018/0074016 A1 | 3/2018 | Chen et al. | |
| 2018/0335484 A1 | 11/2018 | Campiglio et al. | |
| 2018/0335486 A1 | 11/2018 | Lassalle-Balier et al. | |
| 2019/0051822 A1 | 2/2019 | Chatterjee et al. | |
| 2019/0219643 A1 | 7/2019 | Cadugan et al. | |
| 2020/0018780 A1 | 1/2020 | Cadugan et al. | |

FOREIGN PATENT DOCUMENTS

| | | |
|---|---|---|
| EP | 3 288 091 A1 | 2/2018 |
| JP | 2010-080008 A | 4/2010 |
| TW | 2014-36316 A | 9/2014 |
| WO | WO 2005/020242 A2 | 3/2005 |
| WO | WO 2016/196157 A1 | 12/2016 |

OTHER PUBLICATIONS

Yuan et al., "Double-Pinned Magnetic Tunnel Junction Sensors with Spin-Valve-Like Sensing Layers;" Journal of Applied Physics, vol. 118; Published on Aug. 4, 2015; 4 Pages.

Zhang et al., "Large Perpendicular Exchange Bias in CoFeB/MgO Systems Pinned by a Bottom IrMn Layer via an Interfacial CoFe/Ta Composite Layer;" IEEE Transactions on Magnetics, vol. 51, No. 11; Nov. 2015; 4 Pages.

Extended European Search Report dated Jan. 22, 2021 for European Application No. 20192931.2; 11 Pages.

U.S. Appl. No. 16/157,313, filed Oct. 11, 2018, Lassalle-Balier et al.
U.S. Appl. No. 16/157,317, filed Oct. 11, 2018, Lassalle-Balier et al.
U.S. Appl. No. 16/280,199, filed Feb. 20, 2019, Liu et al.
U.S. Appl. No. 16/507,552, filed Jul. 10, 2019, Lassalle-Balier et al.
U.S. Non-Final Office Action dated Apr. 14, 2017 for U.S. Appl. No. 15/165,322; 24 Pages.

Response to U.S. Non-Final Office Action dated Apr. 14, 2017 for U.S. Appl. No. 15/165,322; Response filed May 30, 2017; 23 Pages.
U.S. Notice of Allowance dated Jul. 14, 2017 for U.S. Appl. No. 15/165,322; 14 Pages.

PCT International Search Report and Written Opinion dated Aug. 10, 2016 for International Application No. PCT/US2016/034237; 21 Pages.

PCT International Preliminary Report dated Dec. 14, 2017 for International Application No. PCT/US2016/034237; 16 Pages.
European 161/162 Communication dated Jan. 30, 2018 for European Application No. 16728493.4; 3 Pages.
Response to European 161/162 Communication dated Jan. 30, 2018 for European Application No. 16728493.4; Response filed Aug. 8, 2018; 13 Pages.
European Examination Report dated Sep. 2, 2019 for European Application No. 16728493.4; 5 Pages.
Response (with Amended Claims) to European Examination Report dated Sep. 2, 2019 for European Application No. 16728493.4; Response filed Jan. 13, 2020; 12 Pages.
Taiwan Office Action (with English Translation) dated Feb. 16, 2017 for Taiwan Application No. 105117391; 19 Pages.
Response (with Amended Claims in English) to Taiwan Office Action dated Feb. 16, 2017 for Taiwan Application No. 105117391; Response filed May 4, 2017; 25 Pages.
Taiwan Allowance Decision (with English Reporting E-mail) dated Oct. 31, 2017 for Taiwan Application No. 105117391; 4 Pages.
Japanese Voluntary Amendment (with Amended Claims in English) filed on May 21, 2019 for Japanese Application No. 2017-563135; 16 Pages.
PCT International Search Report and Written Opinion dated Sep. 26, 2019 for International Application No. PCT/US2019/037629; 13 Pages.
U.S. Restriction Requirement dated May 8, 2020 for U.S. Appl. No. 16/047,342; 6 Pages.
Response to Restriction Requirement filed on Jun. 24, 2020 for U.S. Appl. No. 16/047,342; 1 page.
U.S. Appl. No. 16/684,932, filed Nov. 15, 2019, Campiglio et al.
Yu et al., "Perpendicular Magnetic Tunnel Junctions with a Thin FeTa Insertion Layer for 400° C. Thermal Stability;" Applied Physics Express, vol. 11, No. 1; Published Online Dec. 13, 2017; 4 Pages.
Yuasa, "Giant TMR Effect in CoFeB/MgO/CoFeB MTJs;" Section 11.5.2 from Chapter 11 (Tunneling Magnetoresistance in MgO-Based Magnetic Tunnel Junctions Experiment) in the book entitled *Handbook of Spin Transport and Magnetism* by Evgeny Y. Tsymbal and Igor Zutic; Published Aug. 25, 2011; pp. 224-225; 1 Page.
Office Action dated Oct. 14, 2020 for U.S. Appl. No. 16/047,342; 10 pages.
U.S. Restriction Requirement dated Apr. 16, 2021 for U.S. Appl. No. 16/684,932; 6 Pages.
Response to U.S. Restriction Requirement dated Apr. 16, 2021 for U.S. Appl. No. 16/684,932; Response filed Apr. 21, 2021; 1 Page.
Final Office Action dated May 5, 2021 for U.S. Appl. No. 16/047,342; 15 pages.
PCT International Preliminary Report dated Feb. 11, 2021 for International Application No. PCT/US2019/037629; 8 Pages.
Response to U.S. Final Office Action dated May 5, 2021 for U.S. Appl. No. 16/047,342; Response filed Jul. 2, 2021; 15 Pages.

\* cited by examiner

TUNNEL MAGNETORESISTANCE (TMR) ELEMENT HAVING COBALT IRON AND TANTALUM LAYERS

RELATED APPLICATIONS

This application claims the benefit of U.S. Provisional Application No. 62/894,114, filed Aug. 30, 2019, and entitled "TUNNEL MAGNETORESISTANCE (TMR) ELEMENT HAVING COBALT IRON AND TANTALUM LAYERS," which is incorporated herein by reference in its entirety.

BACKGROUND

Magnesium oxide (MgO) magnetic tunnel junctions (MTJs) are widely used spintronics materials due to their high magneto-resistance ratio (MR %). The reason for this high ratio is due to the so-called coherent tunneling mechanism through the MgO barrier which filters in only highly-spin polarized electronic states. When compared with similar giant magnetoresistance (GMR) structures, MTJs generally show lower reference stability (lower spin flop field) and higher free layer anisotropy (higher coercivity).

SUMMARY

In one aspect, a tunnel magnetoresistance (TMR) element includes a magnesium oxide (MgO) layer, a first cobalt iron boron (CoFeB) layer in direct contact with the MgO layer and a first cobalt iron (CoFe) layer. The TMR element also includes a first tantalum layer in direct contact with the first CoFeB layer and the first CoFe layer.

The aspect above may include one or more of the following features. The first CoFeB layer, the first CoFe layer and the first tantalum layer may be part of a reference layer. The first CoFeB layer may be about 0.9 nanometers thick. The first CoFe layer may be about 0.9 nanometers thick. The first tantalum layer may be about 0.1 nanometers thick. A thickness of the first tantalum layer may be between 0.05 nanometers and 0.3 nanometers. The first CoFeB layer, the first CoFe layer and the first tantalum layer may be part of a free layer. The free layer may include a nickel iron (NiFe) layer and the NiFe layer may be in direct contact with the first CoFe layer. The first CoFeB layer may be about 1.0 nanometer thick. The first CoFe layer may be about 1.0 nanometer thick. The TMR element may further include a second CoFeB layer in direct contact with the MgO layer, a second CoFe layer and a second tantalum layer in direct contact with the second CoFeB layer and the second CoFe layer. The second CoFeB layer, the second CoFe layer and the second tantalum layer may be part of a free layer. The first CoFeB layer may be about 0.9 nanometers thick, the first CoFe layer may be about 0.9 nanometers thick, the second CoFeB layer may be about 1.0 nanometer thick and the second CoFe layer may be about 1.0 nanometer thick. The second tantalum layer may be about 0.1 nanometers thick. A thickness of the second tantalum layer may be between 0.05 nanometers and 0.3 nanometers. The TMR element may further include a bias layer in direct contact with the free layer. The bias layer may include a third CoFe layer. The TMR may be single pinned. The TMR may be double pinned.

DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAIL DESCRIPTION

Described herein are techniques to improve the fabrication of a tunnel junction in a tunneling magnetoresistance (TMR) element by having a reference and/or a free layer include a cobalt iron (CoFe) layer and a tantalum layer. In one example, the techniques described herein teach an alternative approach to incorporating cobalt iron boron (CoFeB)/magnesium oxide (MgO)/CoFeB layers into a tunnel junction to reduce the impact of a cubic structure with a hexagonal structure.

Figure 1:
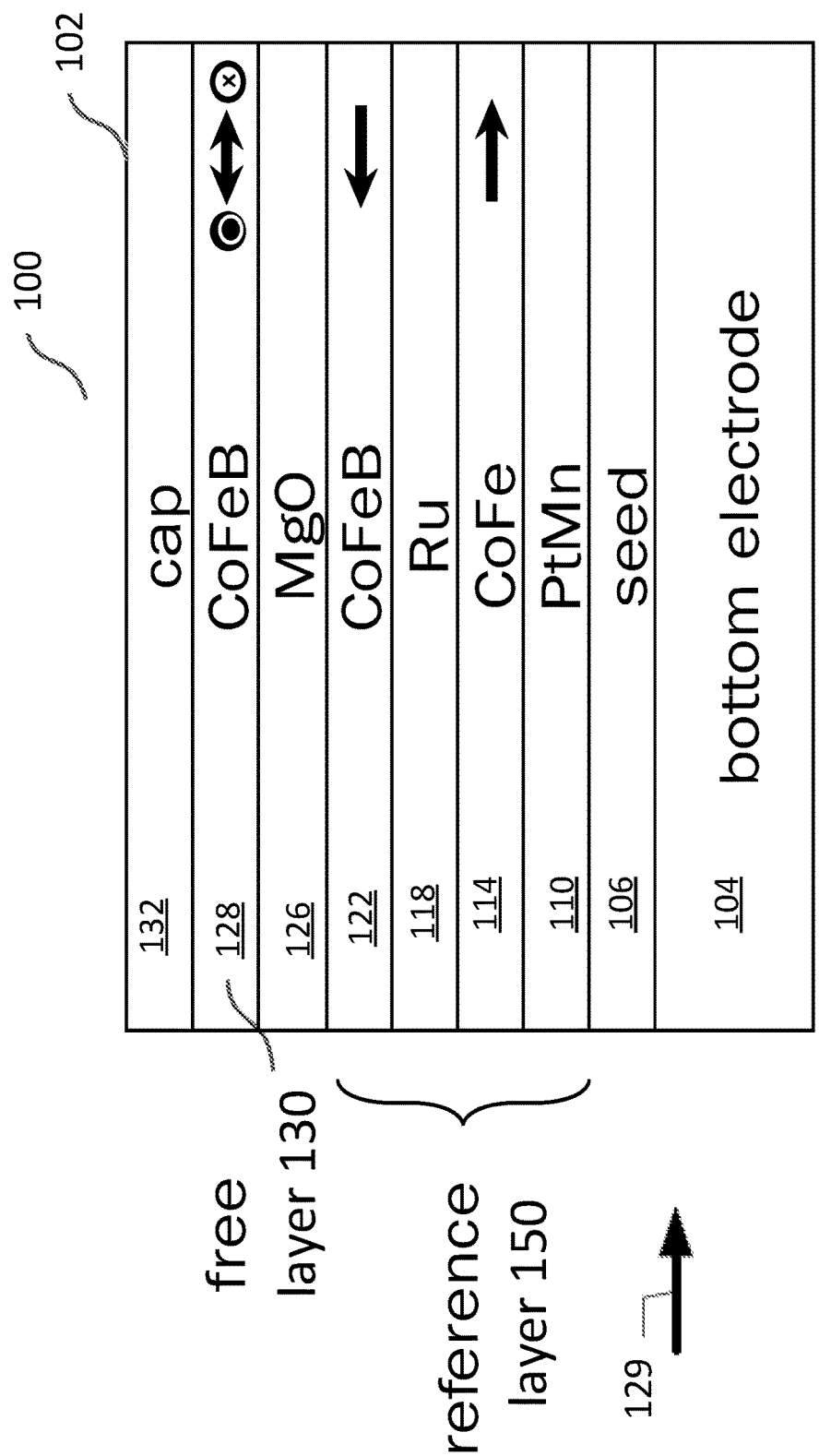
FIG. 1 is a block diagram of a prior art example of a tunneling magnetoresistance (TMR) element.

Referring to FIG. 1, an illustrative TMR element 100 can have a stack 102 of layers 106, 110, 114, 118, 122, 126, 128, 132 indicative of one pillar of a multi-pillar TMR element. Generally, the layer 106 is a seed layer (e.g., a copper nickel (CuN) layer) with the layer 110 located on the seed layer 106. The layer 110 includes platinum manganese (PtMn) or iridium manganese (IrMn), for example. The layer 114 is located on the layer 110 and the layer 118 is located on the layer 114. In one example, the layer 114 includes cobalt iron (CoFe) and the layer 118 is a spacer layer and includes ruthenium (Ru). On the layer 118, a magnesium oxide (MgO) layer 126 is sandwiched between two cobalt iron boron (CoFeB) layers 122, 128. A cap layer 132 (e.g., tantalum (Ta)) is located on the CoFeB layer 128. The layer 114 is a single layer pinned layer that is magnetically coupled to the layer 110. The physical mechanism that is coupling layers 110 and 114 together is sometimes called an exchange bias.

A free layer 130 includes the CoFeB layer 128. In some examples, the free layer 130 may include an additional layer of nickel iron (NiFe) (not shown) and a thin layer of tantalum (not shown) between the CoFeB layer 128 and the NiFe layer.

It will be understood that a driving current running through the TMR element 100 runs through the layers of the stack, running between seed and cap layers 106 and 132, i.e., perpendicular to a surface of a bottom electrode 104. The TMR element 100 can have a maximum response axis that is parallel to the surface of the bottom electrode 104 and that is in a direction 129, and also parallel to the magnetization direction of the reference layer 150, comprised of layers 110, 114, 118, and 122, most notably in the layer CoFeB 122.

The TMR element 100 has a maximum response axis (maximum response to external fields) aligned with the arrow 129, i.e., perpendicular to bias directions experienced by the free layer 130, and parallel to magnetic fields of the reference layer 150, notably pinned layer 122. Also, in general, it is rotations of the magnetic direction of the free layer 130 caused by external magnetic fields that result in changes of resistance of the TMR element 100, which may be due to a change in angle or a change in amplitude if an external bias is present because the sum vector of the external field and the bias is causing a change in the angle between the reference and free layers.

The coherent tunneling mechanism through a magnesium oxide (MgO) barrier (the layer 126) is due to symmetry factors and, as such, it is essential that the MgO barrier and the neighboring CoFeB layers 122, 128 crystallize in a cubic, epitaxial fashion. On the other hand, the non-active part of the MTJs is based on the hexagonal symmetry typical of the (111) plane of face-centered cubic structures. Thus, inserting cubic CoFeB/MgO/CoFeB layers 122, 126, 128 in a hexagonal multilayer must be performed carefully in order not to degrade the response typical of a full-hexagonal system (e.g., a giant magnetoresistance (GMR)).

In the reference layer 150, the main problem of the cubic structure comes from the fact that CoFeB layer 122 is coupled with another CoFe layer 114 through the Ru spacer layer 118. The different crystal symmetry makes this coupling less effective than in an all-hexagonal structure.

Figure 2:
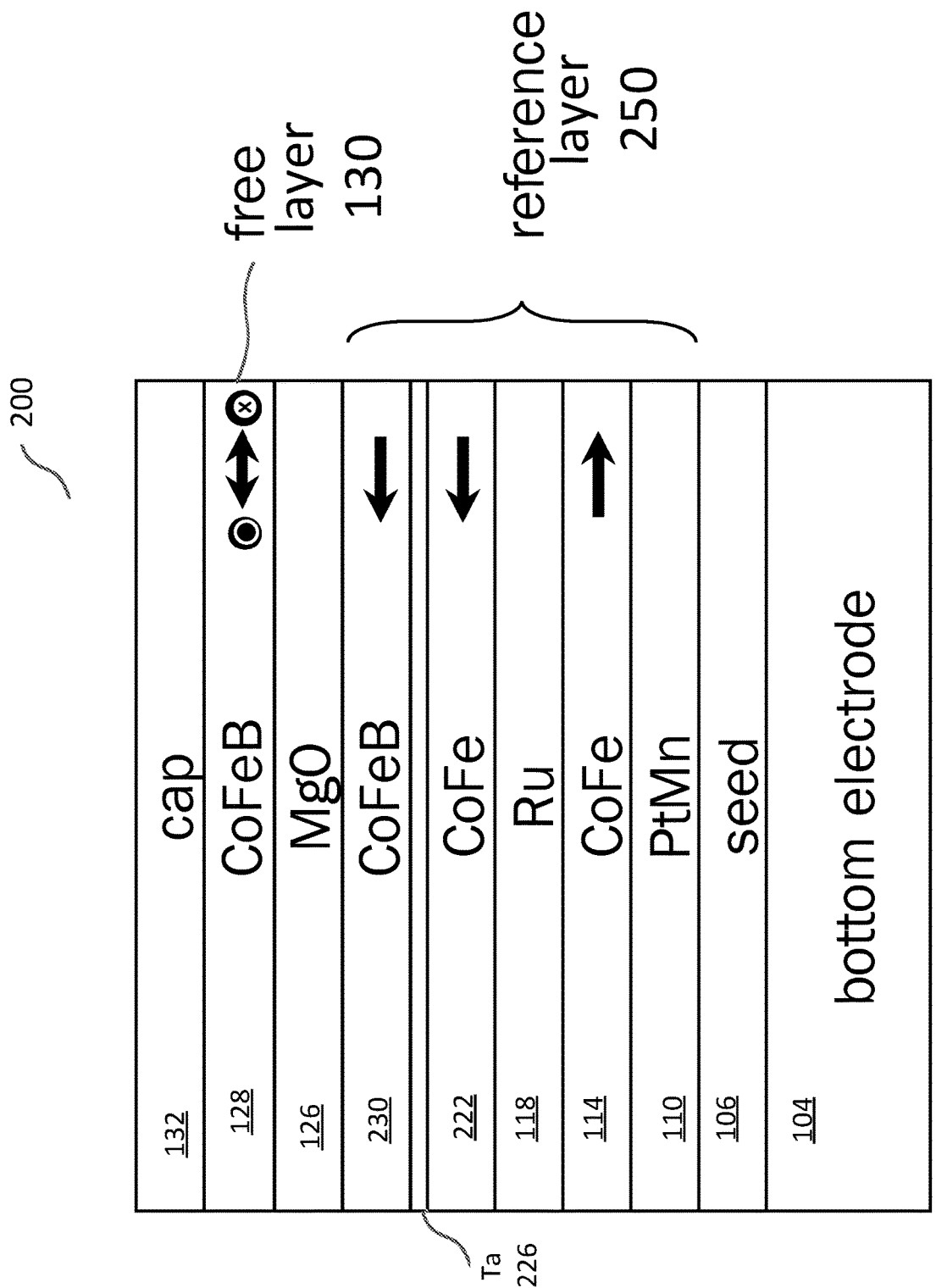
FIG. 2 is a block diagram of an example of a TMR element with a reference layer having a cobalt iron (CoFe) layer and a tantalum layer.

Referring to FIG. 2, to circumvent the difference in crystal symmetry in TMR element 100 (FIG. 1), a TMR element 200 replaces the CoFeB layer 122 (FIG. 2) with a tri-layer that includes a CoFe layer 222, a Ta layer 226 and a CoFeB layer 230. The layers 122, 230 are separated with a thin Ta spacer, which is thin enough to decouple the crystal structures without breaking the ferromagnetic coupling between CoFe and CoFeB. A reference layer 250 includes layers 110, 114, 118, 222, 226, 230.

In one example, the CoFe layer 222 and the CoFeB layer 230 are each about 0.9 nanometers thick. In one example, the Ta layer 226 is about 0.1 nanometers thick. In another example, the Ta layer 226 ranges from 0.05 nanometers to 0.3 nanometers.

Figure 3:
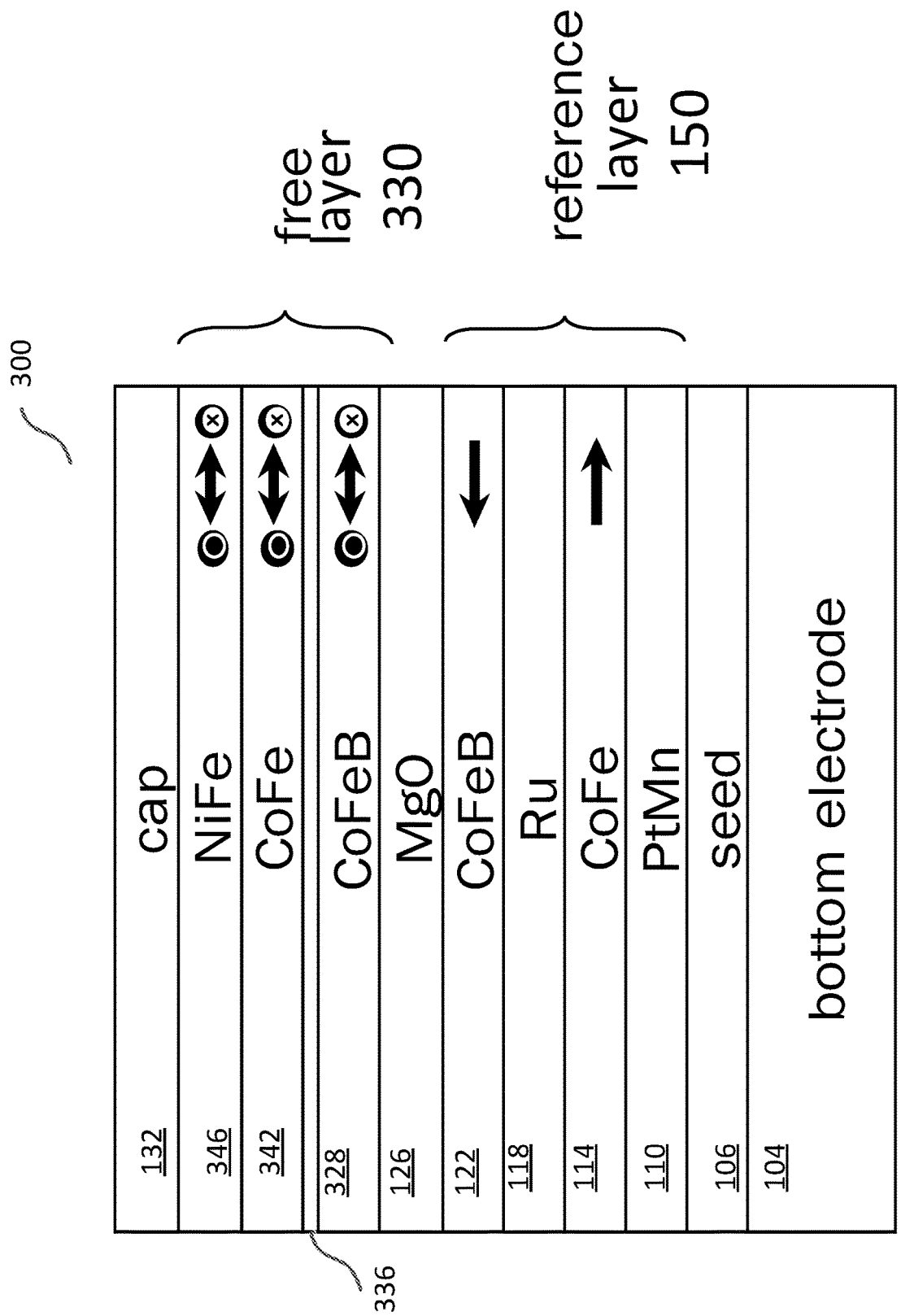
FIG. 3 is a block diagram of another example of a TMR element with a free layer having the cobalt iron (CoFe) layer and the tantalum layer.

Referring to FIGS. 1 and 3, in the free layer 130, the cubic structure of the CoFeB layer 128 causes a higher coercivity in a response. To reduce the coercivity, a TMR element 300 replaces the CoFeB layer 128 with a quad-layer that includes a CoFeB layer 328, a Ta layer 336, a CoFe layer 342 and a nickel iron (NiFe) 346 to form a free layer 330. In particular, the thickness of CoFeB 328 is reduced from the CoFeB layer 128 as much as possible to maintain a good epitaxial structure in the active area. For example, the CoFeB layer 128 is about 2.5 nanometers thick while the CoFeB 328 is about 1.0 nanometers thick. The CoFe 342 coupled with a magnetically softer material of the NiFe layer 346 helps the rotation of the CoFeB 328 by reducing coercivity. In one example, the CoFe layer 342 is about 1.0 nanometers thick. In one example, the Ta layer 336 is about 0.1 nanometers thick. In another example, the Ta layer 336 ranges from 0.05 nanometers to 0.3 nanometers.

Figure 4:
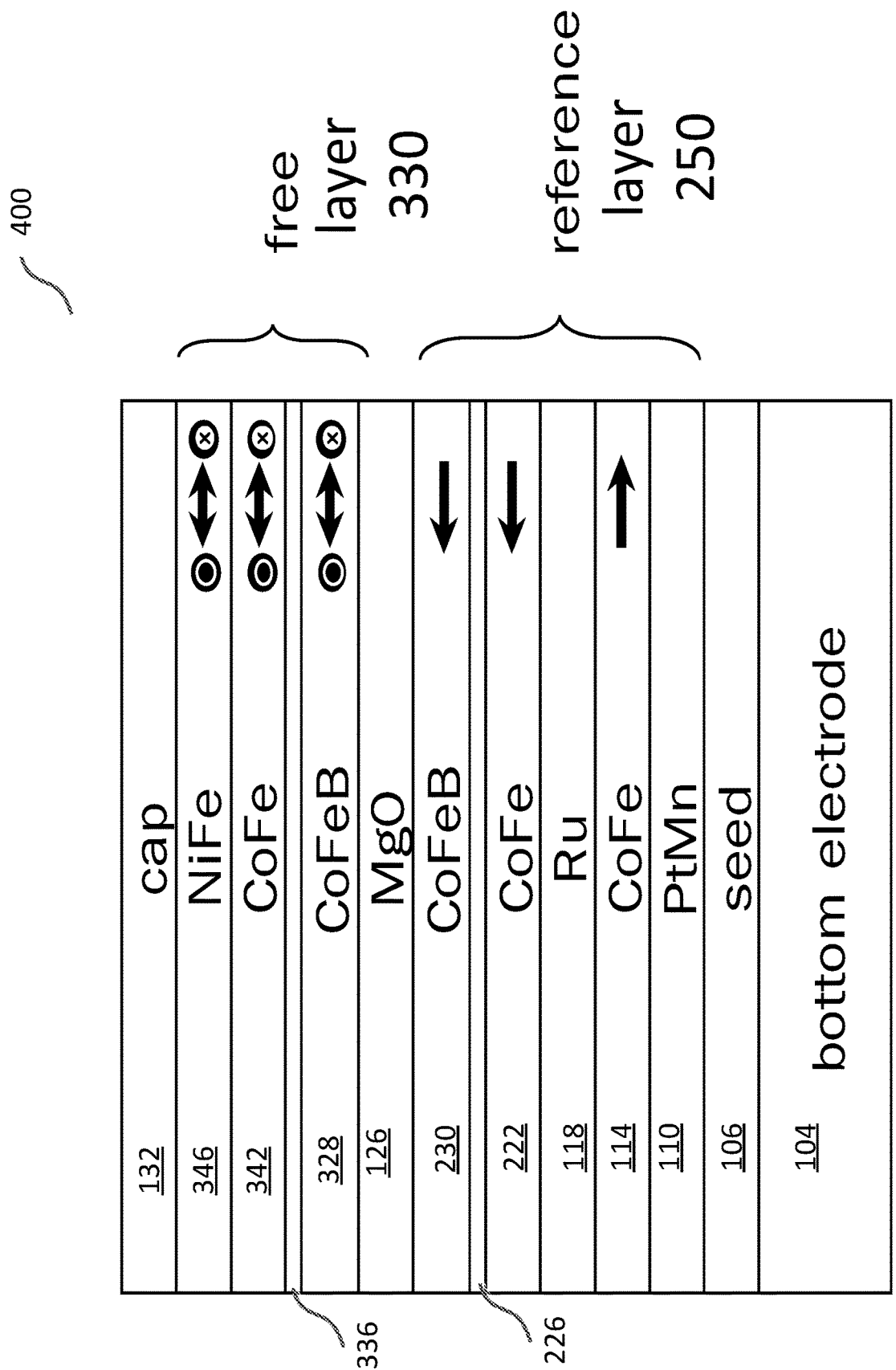
FIG. 4 is a block diagram of a further example of a TMR element with the reference layer and the free layer each having the cobalt iron (CoFe) layer and the tantalum layer.

Referring to FIG. 4, both CoFeB layers 122, 128 (FIG. 1) may also be replaced. For example, a TMR element 400 includes the reference layer 250 of FIG. 2 and the free layer 330 of FIG. 3.

Figure 5:
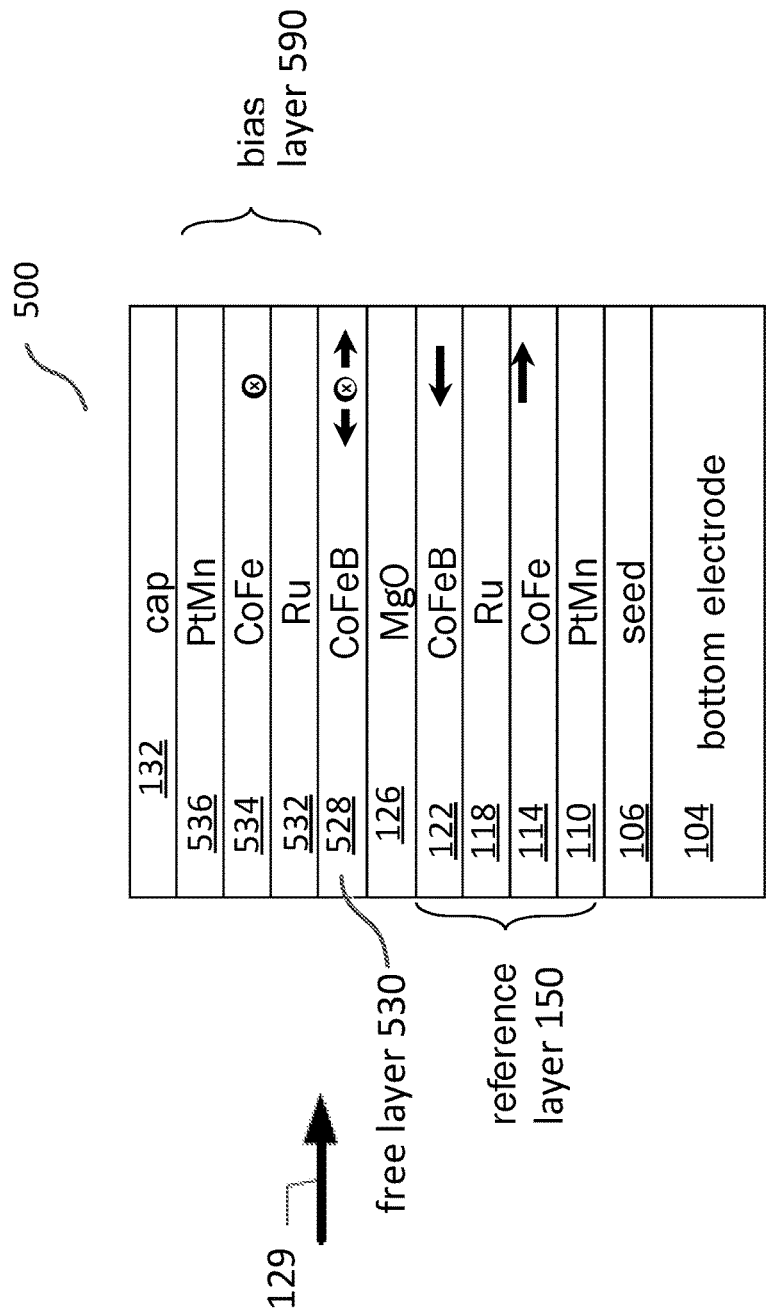
FIG. 5 is a block diagram of a prior art example of a TMR element that is double pinned.

Referring to FIG. 5, a TMR element 500 is the same as TMR element 100 (FIG. 1) except, for example, the TMR includes a bias layer 590. The CoFeB 528 forms a free layer 530. The bias layer 590 includes a Ru layer 532 located on the CoFeB layer 528, a CoFe layer located on the Ru layer 532 and a PtMn layer 536 located on the CoFe layer 534.

The TMR element 500 is double pinned, i.e., it has two pinning layers 536, 110. A pinned layer structure 534, 532, 528 is magnetically coupled to the pinning layer 536. The single layer pinned layer 114 is magnetically coupled to the pinning layer 110. With zero external magnetic field, the free layer 530 takes on a magnetic alignment parallel to the bias layer 590, with direction (ferromagnetic or antiferromagnetic coupling) determined by thickness and material of the spacer layer 532. Thus, double pinned means that the free layer 530 is stabilized by intra-stack bias from the bias layer 590. The free layer 530 may go parallel or antiparallel to the reference layer 150 depending on the direction of the external field 129.

Figure 6:
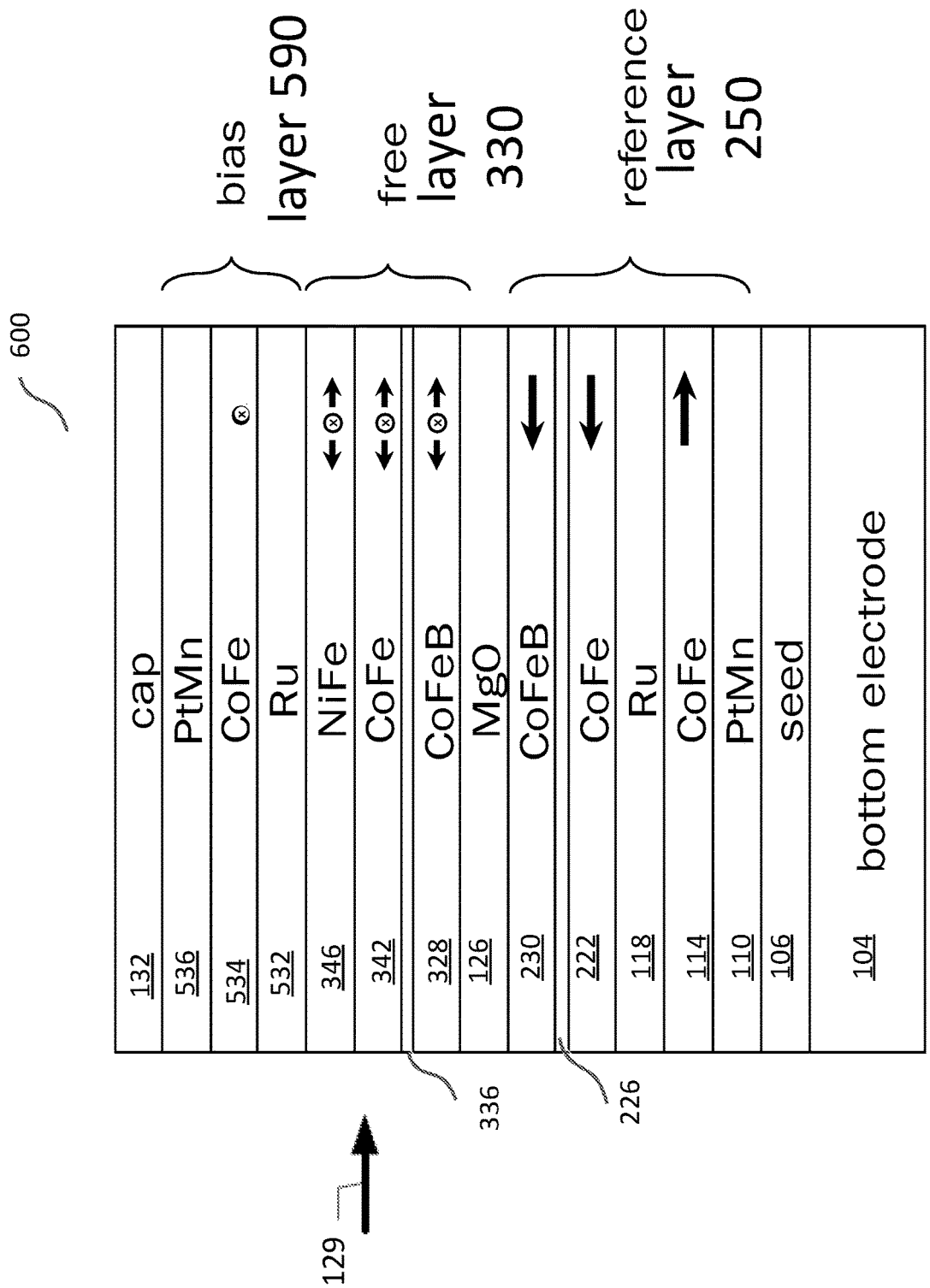
FIG. 6 is a block diagram of a still further example of a TMR element that is double pinned with the reference layer and the free layer each having the cobalt iron (CoFe) layer and the tantalum layer.

Referring to FIG. 6, the techniques described in FIGS. 2 to 4 may also be applied to the TMR element 500 (FIG. 5). For example, in a TMR element 600, the free layer 530 (FIG. 5) is replaced with the free layer 330 and the reference layer 150 (FIG. 5) is replaced with the reference layer 250.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A tunnel magnetoresistance (TMR) element, comprising:
  a cap layer;
  a bias layer in direct contact with the cap layer, the bias layer comprises:
    a first platinum manganese layer in direct with the cap layer;
    a first cobalt iron layer in direct contact with the first PtMn layer; and
    a first ruthenium layer in direct contact with the first CoFe layer;
  a free layer in direct contact with the bias layer, the free layer comprising:
    a nickel iron layer in direct contact with the first Ru layer;
    a second CoFe layer in direct contact with the NiFe layer;
    a first tantalum layer in direct contact with the second CoFe layer; and
    a first cobalt iron boron in direct contact with the first Ta layer;
  a magnesium oxide MgO layer in direct contact with the first CoFeB layer;
  a reference layer in direct contact with the MgO layer, the reference comprising:
    second CoFeB layer in direct contact with the MgO layer;
    a third CoFe layer in direct contact with a second Ta layer;
    the second Ta layer in direct contact with the second CoFeB layer and the third CoFe layer;
    a second Ru layer in direct contact with the third CoFe layer;
    a fourth CoFe layer in direct contact with the second Ru layer; and
    a second PtMn layer in direct contact with the fourth CoFe layer; and a seed layer in direct contact with the second PtMn layer,
wherein the first PtMn layer pins the bias layer, and
wherein the second PtMn layer pins the fourth CoFe layer.

2. The TMR of claim 1, wherein the first and second CoFeB layers are each 0.9 nanometers thick.

3. The TMR of claim 1, wherein the first, second, third and fourth CoFe layers are each 0.9 nanometers thick.

4. The TMR of claim 1, wherein the first and second tantalum layers are each 0.1 nanometers thick.

5. The TMR of claim 1, wherein a thickness of the first and second tantalum layers are each between 0.05 nanometers and 0.3 nanometers.

\* \* \* \* \*

UNITED STATES PATENT AND TRADEMARK OFFICE
CERTIFICATE OF CORRECTION

PATENT NO. : 11,127,518 B2
APPLICATION NO. : 16/574419
DATED : September 21, 2021
INVENTOR(S) : Paolo Campiglio et al.

It is certified that error appears in the above-identified patent and that said Letters Patent is hereby corrected as shown below:

In the Specification

Column 3, Line 2 delete "layer CoFeB" and replace with --CoFeB layer--.

Column 3, Line 51 delete "CoFeB 328" and replace with --CoFeB layer 328--.

Column 3, Line 54 delete "CoFeB 328" and replace with --CoFeB layer 328--.

Column 3, Line 55 delete "CoFe 342" and replace with --CoFe layer 342--.

Column 3, Line 57 delete "CoFeB 328" and replace with --CoFeB layer 328--.

Column 4, Line 1 delete "CoFeB 528" and replace with --CoFeB layer 528--.

Column 4, Line 36 delete "direct with" and replace with --direct contact with--.

Column 4, Line 56 delete "second" and replace with --a second--.

Signed and Sealed this
Fifteenth Day of November, 2022

Katherine Kelly Vidal
*Director of the United States Patent and Trademark Office*